Oct. 3, 1972 L. F. BOYER ET AL 3,695,928
SELECTIVE COATING
Filed Dec. 7, 1970 2 Sheets-Sheet 1

INVENTORS
L.F. BOYER
A.F. JOHNSON JR.
BY R.Y. Peters
ATTORNEY

Oct. 3, 1972 L. F. BOYER ET AL 3,695,928

SELECTIVE COATING

Filed Dec. 7, 1970 2 Sheets-Sheet 2

3,695,928
SELECTIVE COATING
Lynn Forrest Boyer, Reading, and Anderson Forbes Johnson, Jr., Sinking Spring, Pa., assignors to Western Electric Company, Incorporated, New York, N.Y.
Filed Dec. 7, 1970, Ser. No. 95,821
Int. Cl. B44d *1/18, 1/52;* B05c *11/12*
U.S. Cl. 117—212 12 Claims

ABSTRACT OF THE DISCLOSURE

In making a diode array target for a television camera tube from a silicon substrate, the face of the substrate is flooded with a photoresist masking material and the substrate is then spun to form a uniform coating of the material on the face. Due to the overflowing, breaking down and scattering of the material on the substrate and due to leakage from a vacuum spindle holding the substrate, the material often creeps over, or splashes on, the backside of the substrate opposite the face. This results in a decrease in the uniformity of the diode array and requires an additional processing step to make the target. To prevent the material from creeping over, or splashing on, the backside and thereby reduce the processing steps and increase the uniformity of the diode array, a fluid is forced radially outward in an annular pattern from the center of the substrate and against the backside as it is spun. An apparatus for effecting this flow includes an annular nozzle positioned beneath the substrate and formed by an upper beveled flange and a coacting chamfered portion of a pair of tubular members.

BACKGROUND OF THE INVENTION

Field of the invention

This invention relates to methods of selectively coating workpieces, and more particularly, to methods of making diode-array targets from semiconductive substrates for electron-beam charge-storage devices such as television camera tubes.

Description of the prior art

This invention is particularly suited for use in the manufacture of semiconductive devices or the like. An example of such semiconductive devices are silicon targets having arrays of light-sensitive photo diodes for the storeage of electron-beam charges, such as those disclosed in Reynolds Pat. 3,011,089 and Buck et al. Pats. 3,403,284 and 3,458,782.

While the invention is adapted to be used in conjunction with the selective coating of objects, it will be particularly described with respect to diode-array targets for electron-beam charge-storage devices such as television camera tubes. Such a diode-array target is basically a flat semiconductive substrate having a closely spaced array of p-n junctions near one surface.

In fabricating the diode array target in accordance with the present techniques, an n-type substrate is prepared by sawing it from a silicon crystal ingot and then etching and polishing it. After a careful cleaning, a layer of silicon dioxide is formed over the entire substrate.

Next, a photoresist masking material is deposited on the substrate which is spun to coat it evenly. The substrate is then exposed with the required diode-array pattern and developed to form apertures in the photoresist masking material. Etching of the substrate through these apertures follows to produce corresponding apertures in the silicon dioxide layer. Through the apertures in the silicon dioxide layer, boron is diffused to form p-type regions, with the dioxide layer acting as a diffusion mask. These p-type regions in the n-type substrate form the diode array on one side of the substrate.

Following the formation of the diode array, the substrate is mounted with wax to a supporting disc with the diode array side down. The backside of the substrate is first etched to remove any silicon dioxide remaining on it and then etched again to remove any boron-diffused material from the peripheral area of the backside. Next, a wax ring is painted on this peripheral area so that a supporting rim will remain on the backside of the substrate after a subsequent etching step. In that etching step, the substrate is immersed in the etchant and rotated therein for a period sufficient to thin down the substrate to a predetermined thickness. This thickness is considerably less than the diffusion length of minority carriers generated by absorbed light in the ultimate target and limits the amount of lateral diffusion of minority carriers in order to obtain high resolution in the target.

After thinning, the substrate is subjected to several finishing heat treatments. The first of these treatments is a shallow phosphorous diffusion to improve the blue sensitivity of the ultimate camera tube and to reduce its dark current. Next, the boron diffusion glass, which has been left on the array side of the substrate up to this point to protect it against phosphorous diffusion, is removed to expose the p-type regions of the diodes. At the same time that the boron diffusion glass is removed, the phosphorous diffusion glass is also removed.

Next, the substrate is annealed in hydrogen at a low temperature to further reduce the dark current of the ultimate camera tube. Finally, a resistive film is evaporated over the diode array and it is ready for evaluation.

In fabricating the diode-array target, it is desirable to eliminate as many processing steps as possible, and at the same time increase the uniformity of the physical and electrical characteristics of the individual diodes in the array. It is also very important that no physical damage or contamination results from any methods used to make the diode-array targets or any apparatus used to handle the substrates.

SUMMARY OF THE INVENTION

It is, therefore, an object of this invention to provide new and improved methods of selectively coating a workpiece.

Another object of this invention is the provision of methods of making from a semiconductive substrate an electron-beam target having a highly uniform diode array.

With these and other objects in view, the present invention contemplates a new method of selectively coating a workpiece which includes the steps of applying a material to the workpiece and forcing a fluid under pressure against a portion of the workpiece where the material is not desired to prevent the material from coating such portion of the workpiece.

BRIEF DESCRIPTION OF THE DRAWINGS

Other objects and advantages of the present invention may be more clearly understood by reference to the following detailed description and accompanying drawings, wherein.

DETAILED DESCRIPTION

Diode array target

Figure 4:
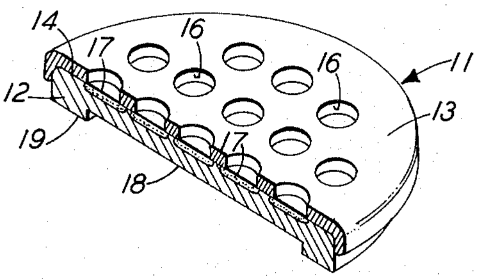

Referring now to the drawings and in particular to FIG. 4, a diode array target, designated generally by the numeral 11, is shown. Such target 11 includes an n-type semiconductive substrate 12, preferably silicon, having a layer 13 of silicon dioxide formed on the face or the surface 14 thereof. Through the layer 13 a plurality of apertures 16 are formed. Corresponding to these apertures 16 are a plurality of p-type regions 17 which are formed through the apertures 16 in the surface 14 of the substrate 12. The p-type regions 17 together with the n-type substrate 12 form an array of light-sensitive photo diodes.

The substrate 12 has an extremely thin central portion 18 for reducing the distance minority carriers must travel to the diodes on the opposite surface 14 of the substrate 12 and for limiting the lateral diffusion of these carriers. The substrate 12 also includes a relatively thick rim 19 on the periphery thereof for supporting it.

In using the diode array target 11 in a television camera tube application, the light being sensed impinges on the central portion 18 of the substrate 12 producing minority carriers that travel to the diode-array in the opposite surface 14, while an electron beam from a cathode scans the diode array in the surface 14.

Ttypically, the substrate 12 has the configuration of a disc with a diameter of about 850 mils and with the central portion 18 being about 760 mils in diameter and about 0.6 mil thick. The ring portion 19 typically is about 5 mils thick. Usually there are about 1,000,000 individual diodes in the array in the surface 14 of the substrate 12, and about 650,000 of these are used when the target 11 is mounted in a television camera tube. Obviously, the relative proportions in FIGS. 1–4 have been exaggerated to more clearly illustrate the target 11.

Fabricating method

The present invention can best be illustrated by first briefly describing the prior art method of fabricating the diode-array target 11 (FIG. 4) and some of the problems in connection therewith.

In fabricating the target 11 by the prior art method, the substrate 12 (FIG. 1) is formed by sawing a slice from a silicon crystal ingot and then etching and polishing it. After a careful cleaning, the silicon dioxide layer 13 is formed by thermal oxidation over the entire substrate 12.

Next, the substrate 12 is positioned for spin coating on, and securely held by, a vacuum chuck (not shown). Then, the top surface 22 (FIG. 1) of the silicon dioxide layer 13 is flooded with a photoresist masking material, and the substrate 12 is allowed to sit for a short time to allow the masking material to become distributed over the entire top surface 22 and form a layer 23 with meniscus 24. The substrate 12 is then rapidly accelerated to a high spinning velocity and is left spinning for a short time. The spinning of the substrate 12 breaks down and scatters the layer 23 of masking material and forms a thin uniform coating 26 (FIG. 2) of the material on the top surface 22 of the layer 13 with a portion of the coating 26 overlying part of the edge of the layer 13, as shown in FIG. 2.

Figure 1:
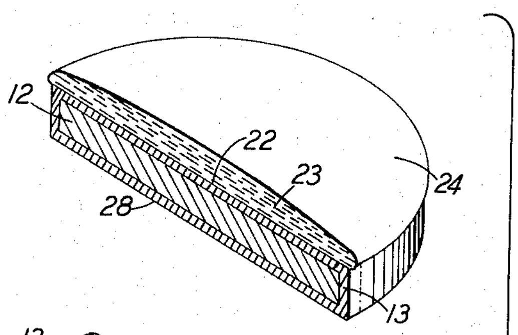
FIGS. 1–4, inclusive, are greatly enlarged perspective views, partially in section, showing a summary of the processing sequence for making diode-array targets and illustrating some problems of the prior art.
Figure 2:
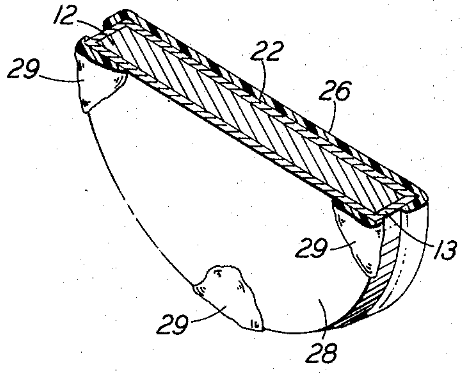

A major problem with this prior art method is that as the substrate 12 is spun, the photoresist masking material often creeps over, or splashes on, the backside or bottom surface 28 (FIG. 2) of the silicon dioxide layer 13 of the substrate 12, and forms undesirable coatings 29 at various locations on such surface 28, as shown in FIG. 2.

It has been found that these coatings 29, which overlie and protect portions of the silicon dioxide layer 13 during a first etching operation, cause these portions to remain on the bottom surface 28. Consequently, a second etching operation is required to remove them. After the removal of these coatings 29 and of these underlying portions, the diode array in the surface 14 of substrate 12 opposite these coatings 29 has different electrical characteristics than the diode array not opposite such coatings 29. Hence, such diode array lacks uniformity.

While the exact reason for this lack of uniformity is not known for certain, it has been theorized that these portions of the silicon dioxide layer 13 underlying the coatings 29 cause internal stresses in the crystal lattice of the substrate 12 even after the removal of the coatings 29 and the underlying portions of the layer 13. These stresses which are located in these areas where the coatings 29 and underlying portions had been, apparently result in certain electrical characteristics in the diode array formed in the surface 14 of the substrate 12. Because of its extreme thinness (about 0.6 mil thick at the central portion 18), the substrate 12 is especially susceptible to such stresses. These electrical characteristics are different from those that are exhibited by the diode array where there are no such stresses; hence, uniformity of the diode array is decreased as a result of the creep-over problem. Significantly, this decrease in uniformity often renders the targets 11 defective.

It is believed that the creep-over problem is caused, at least in part, (a) by the overflowing of the masking material to the edges and the bottom surface 28 of the substrate 12 during the flooding of the surface 14 with the masking material, (b) by the breaking down and scattering of the layer 23 of masking material by the rapid acceleration of the substrate 12 in spinning it, and (c) by leakage from the vacuum chuck that holds the substrate 12, tending to draw the scattered material toward the center of the surface 28 and to the chuck.

In the making of the target 11 by the prior art method, the next step is the forming of a plurality of apertures (not shown) in the layer 26 (FIG. 2) of the photoresist masking material. The apertures are formed by conventional photolithographic techniques in accordance with the desired array of diodes.

Figure 3:
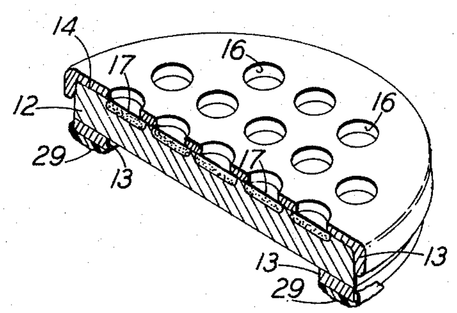
PRIOR ART FIG.-3

After the forming of these apertures in the layer 26, the apertures 16 (FIG. 3) are formed in the silicon dioxide layer 13 by the first etching operation, wherein the substrate 12 is immersed in hydrofluoric acid. Those portions of the silicon dioxide layer 13 that are not protected by the layers 26 and 29 of photoresist masking material are etched away, thereby forming the apertures 16 in the layer 13 and removing those portions of the layer 13 which do not have their bottom surface 28 underlying the coatings 29, as shown in FIG. 3.

Then, the coatings 26 and 29 of the photoresist masking material are removed by conventional dissolving and washing techniques, leaving on the substrate 12 those portions of the silicon dioxide layer 13 that had been underlying such coatings 26 and 29.

Next, through the apertures 16 in the silicon dioxide layer 13, boron is diffused to form the p-type regions 17 in the n-type substrate 12, with the layer 13 acting as diffusion mask. The p-type regions 17 in the n-type substrate 12 form the diode array on the surface 14 of the substrate 12.

Following the formation of the diode array and in accordance with the prior art method, the substrate 12 is mounted with wax to a supporting disc (not shown) with the silicon dioxide layer 13 and the surface 14 with the diode array facing down on the supporting disc. The second etching operation is then performed. In this operation the backside of the substrate 12 is etched in hydrofluoric acid to remove those portions of the silicon dioxide layer 13 of the bottom surface 28 thereof that had been underlying the coatings 29 of the photoresist masking material. Such portions of the layer 13 must be removed to provide a clear path to the central portion 18 of the substrate 12, and, as mentioned above, such removal in accordance with prior art techniques leaves the array deficient in uniformity, possibly due to the development of internal stress in the extremely thin substrate 12.

After the removal of the silicon dioxide layer 13 underlying the coating 29, the peripheral area of the backside of the substrate 12 is etched in accordance with the prior art method in nitric, hydrofluoric, and acetic acid saturated with iodine. This etching removes any boron-diffused material on this area of the substrate 12.

In the prior art method, a wax ring (not shown) is then painted on the peripheral area of the backside of the substrate 12 to define the rim 19 (FIG. 4) for supporting the substrate 12. This rim 19 is left on the substrate 12 after a subsequent etching step wherein the thin central portion 18 is formed in the substrate 12. The substrate 12 is then immersed in the aforementioned iodine saturated acid and rotated therein for a period sufficient to thin down the substrate 12 to form the central portion 18 with a thickness of about 0.6 mil.

Coating apparatus and method with air nozzle

Figure 5:
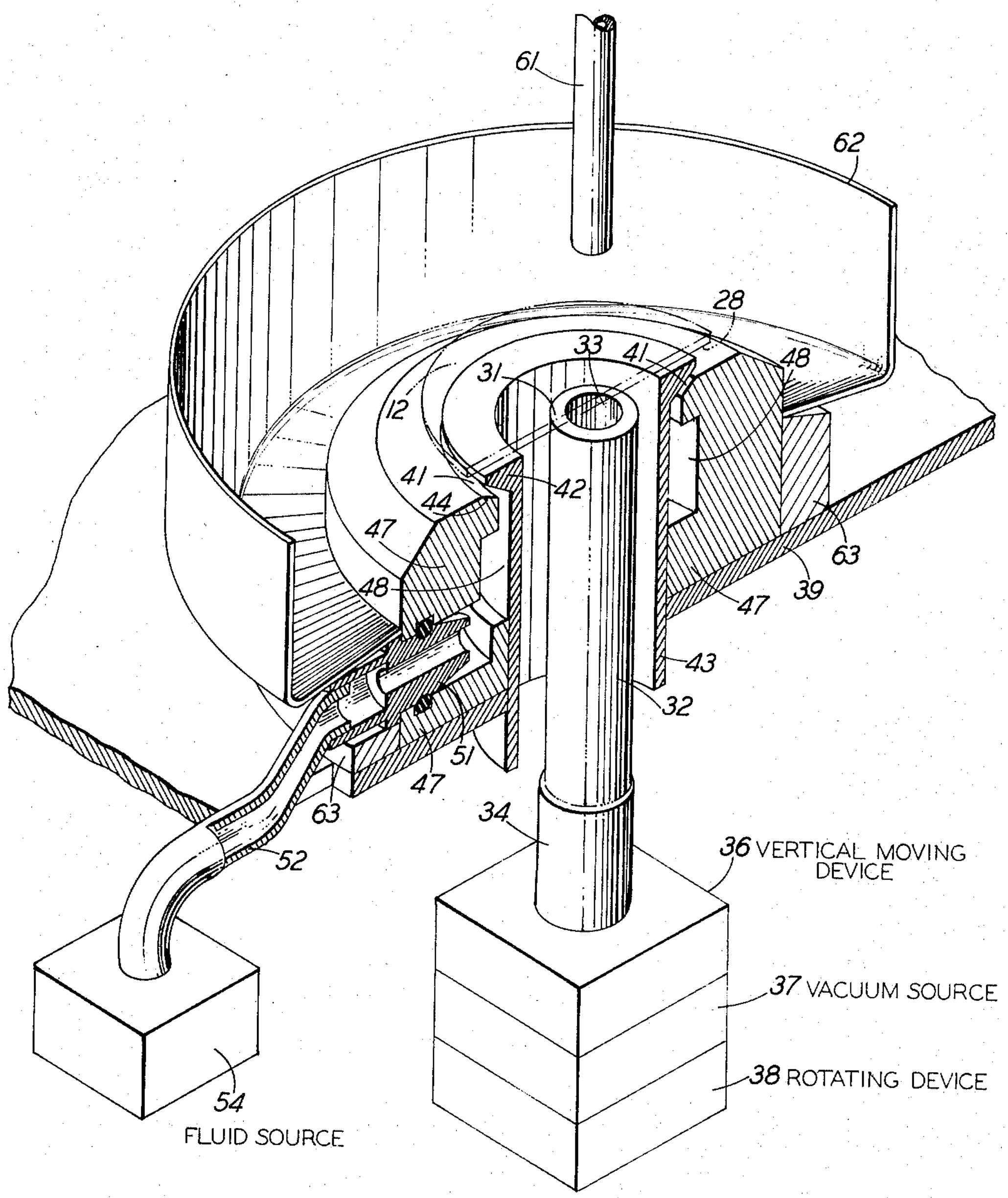
FIG. 5 is an enlarged perspective view, partially in section, of an apparatus for selectively coating a workpiece, illustrating a nozzle for forcing fluid under pressure against a portion of the workpiece where coating material is not desired.

In accordance with the present invention, the aforementioned problem of creep-over with the resultant lack of diode uniformity is overcome by the use of the selective coating apparatus of FIG. 5. The use of this apparatus also reduces the number of processing steps required to make the target 11.

In using this apparatus, the substrate 12 which already has the silicon dioxide layer 13 formed thereon is positioned on and held by a free end 31 of a hallow tubular member 32 having a passageway 33 therein. The tubular member 32 also has an end 34, opposite the free end 31, which is associated with several conventional expedients (shown diagrammatically in FIG. 5) including a vertical moving device 36, a vacuum source 37, and a rotating device 38. While the device 38 is shown associated with the tubular member 32 for moving it vertically, it should be understood that the device 36 may instead be associated with a platform 39 for moving it vertically. (Some of these expedients are incorporated in Model No. 6604 of an Automatic Photoresist Coater manufactured by Industrial Modular Systems Corporation, Cupertino, Calif.)

The vacuum source 37 is connected to the passageway 33 of the tubular member 32 to produce a vacuum at the free end 31 thereof to securely hold the substrate 12 on such free end 31 during a subsequent spin coating operation. For increasing the ease of positioning the substrate 12 on the free end 31, the tubular member 32 is vertically movable by the device 36. Also, the tubular member 32 is rotatable by the device 38 for the subsequent spin coating operation.

An annular fluid projecting vent or nozzle 41 (FIG. 5) is located circumferentially about and spaced from the tubular member 32 and is formed by an upper beveled flange 42 of an inner tubular member 43 and by a coacting chamfered portion 44 of an outer tubular member 47. The nozzle 41 is spaced from the substrate 12 so as not to interfere with the substrate 12 as it is spun by the rotating device 38, and the tubular member 43 is fixed to the platform 39. Of course, if the vertical moving device 36 is associated with and moves the platform 39, as previously described as an alternative, then the tubular member 43 is slidably mounted in the platform 39.

The inner and outer tubular members 43 and 47 forming the nozzle 41 also form a cavity 48 communicating with the annular nozzle 41 and also communicating, through a sealed fitting 51 and a tube 52, with a source 54 of a fluid under pressure.

The nozzle 41 forces the fluid, which may be a liquid or gas, but preferably is either nitrogen or air, from the source 54 in an annular pattern against and radially outward from the bottom surface 28 of the silicon dioxide layer 13 of the substrate 12. The fluid after striking the bottom surface 28 of the substrate 12 is forced radially outward away from the substrate 12.

In carrying out the present invention, the photoresist masking material is applied to the top surface 22 (FIG. 1) of the silicon oxide layer 13 of the substrate 12 by a conventional dispensing device 61 (FIG. 5). Advantageously, the top surface 22 is flooded with the material and the substrate 12 is allowed to sit for about 20 seconds to allow the material to become distributed over such surface 22 to form the layer 23. Preferably, the material is applied to the surface 22 after the nozzle 41 forces the fluid from the source 54 against the bottom surface 28 of the substrate 12, thereby preventing any such material from contacting such bottom surface 28. However, it should be understood that the fluid can be forced against such surface 28 at the same time that the material is applied.

Next, the rotating device 38 is energized to rapidly accelerate the substrate 12 to a spinning velocity in the range of about 3000 to 6000 r.p.m. and it is left spinning for about 15 seconds. The spinning of the substrate 12 is sufficient to break down, and scatter the layer 23 (FIG. 1) and to form the uniform coating 26 (FIG. 2) of the masking material on the top surface 22 of the layer 13 with a portion of the coating 26 overlying part of the edge of the layer 13, as shown in FIG. 2. A conventional retaining cup 62, supported by a ring 63 and the outer tubular member 47 surrounds the substrate 12 and collects the photoresist masking material thrown from the spinning substrate 12 and forced radially outward by the fluid from the nozzle 41. After the spinning, the coating 26 has a thickness of about 1 micron.

Although the layer 23 of the photoresist masking material is broken down and scattered by the rapid acceleration of the substrate 12 as it is spun and the leakage of the vacuum at the free end 31 of the tubular member 32 tends to draw the scattered material toward the center of the bottom surface 28 of the layer 13, the masking material does not creep-over, or splash on, the bottom surface 28 of the layer 13 and does not form any coatings 29 (FIG. 2). This is because the nozzle 41 of the selective coating apparatus of FIG. 5 forces the fluid from the source 54 against the bottom surface 28 of the layer 13 as the substrate 12 is spun. As a result, the creep-over problem of the prior art with the resultant lack of uniformity of the diode array is solved. Further, the selective coating apparatus of FIG. 5 does not physically damage or contaminate the substrate 12.

Certain adjustments to the apparatus of FIG. 5 are necessary. For example, the vacuum of the source 37 is adjusted to securely hold the substrate 12 at the free end 31 of the tubular member 32. Also, the volume and the pressure of the fluid of the source 54 are adjusted so that the force of the fluid against the bottom surface 28 of the substrate 12 is sufficient to prevent the masking material from being conveyed to the bottom surface 28. It has been observed that the fluid from the source 54 being forced against the bottom surface 28 tends to aid the vacuum from the source 37 in securely holding the substrate 12 to the free end 31 of the tubular member 32. This additional holding action by the fluid 12 is believed to be due to the Bernoulli principle.

After the coating 26 of the photoresist masking material is formed on the silicon dioxide layer 13 in accordance with the present invention, the aforementioned thinning operation is performed, except that the aforementioned first etching operation of the backside of the substrate 12 with hydrofluoric acid to remove any remaining silicon dioxide is now eliminated.

After the thinning operation, the substrate 12 is removed from the support disc and subjected to several conventional finishing heat treatments. The first of these treatments is a shallow phosphorous diffusion to improve the blue sensitivity of the ultimate camera tube and to reduce the dark current. The boron diffusion glass, which was left on the surface 14 of the substrate 12 up to this point to protect the diode array against the phosphorous diffusion, is now removed by immersing the substrate 12 in an etchant of hydrofluoric acid. The removal of this boron diffusion glass exposes the p-type regions of the diode array in the surface 14. At the same time that the boron diffusion glass is removed, the phosphorous diffusion glass is also removed.

Next, the substrate 12 is annealed in hydrogen at a low temperature to further reduce the dark current of the ultimate camera tube. Finally, a resistive sea layer is applied to the surface 14 having the diode array thereon. This layer is produced by evaporating antimony trisulphide in a bell jar vacuum system. After the application of this layer, the target 11 is completed and ready for evaluation.

While the invention has been described in connection with semiconductive substrates such as diode array targets, it should be understood that the invention may also be used in connection with other articles.

What is claimed is:

1. A method of selectively coating and controlling the electrical characteristics of a semiconductive workpiece having a top surface and an opposed bottom surface, comprising:

applying a material to the top surface of the workpiece that is capable of rendering non-uniform the electrical characteristics of the workpiece by contact with the bottom surface thereof; and forcing simultaneously a fluid under pressure in an annular pattern against the bottom surface of the workpiece where the material is not desired, to prevent the material from coating such bottom surface of the workpiece and to further prevent such material from rendering non-uniform the electrical characteristics of the workpiece.

2. The method of claim 1, wherein the fluid is forced against the workpiece before the material is applied to the workpiece.

3. The method of claim 1, wherein the workpiece is supported on a member prior to the application of the material thereto, and wherein the fluid forced against the workpiece tends to produce a holding force between the workpiece and the member.

4. A method of selectively coating a semiconductive workpiece, comprising:

applying a material in liquid form to the face of the workpiece;

forcing a fluid under pressure from a nozzle adjacent to and spaced from the workpiece in an annular pattern against the side of the workpiece opposite the face; and spinning the workpiece to spread the material thereon, the fluid preventing the material from contacting the side of the workpiece opposite the face.

5. A method of coating a semiconductive substrate having a face and an opposite side with a masking material, comprising the steps of:

positioning the side of the substrate opposite the face on the free end of a hollow tubular member;

producing a vacuum at the opposite end of the tubular member to hold the substrate on the free end thereof;

forcing a gas under pressure to strike in an annular pattern against the side of the substrate opposite the face;

flooding the face of the substrate with a masking material; and rotating the tubular member to spin the substrate to thereby spread the material on the face thereof, the gas under pressure striking the side of the substrate opposite the face while the tubular member is rotating to prevent the masking material from contacting the portion of the side of the substrate opposite the face located within such annular pattern.

6. The method of claim 5 wherein the gas is air.

7. The method of claim 5, wherein the gas forced against the side of the substrate aids the vacuum in holding the substrate to the tubular member.

8. An improved method of making a charge storage device from a semiconductive substrate of a first conductivity having a face and a backside opposite the face, wherein an oxide is formed on the face and the backside of the substrate, wherein a masking material is applied to the face, wherein openings are formed in the masking material, wherein corresponding openings are formed in the oxide, wherein a doping impurity is diffused through the openings in the oxide to form regions of a second conductivity to thereby form a diode array in the substrate, wherein the improvement comprises:

forcing a fluid under pressure from a nozzle adjacent to and spaced from the substrate in an annular pattern against the backside of the substrate to prevent the masking material from contacting such backside during the application thereof.

9. A method of making an electron beam target having a substantially uniform diode array from a semiconductive substrate, the major portion of which is of a first conductivity, the substrate having a layer of an oxide on its face and on its backside opposite the face, comprising the steps of:

applying a masking material to the face of the substrate;

forcing a fluid under pressure from a nozzle adjacent to and spaced from the substrate in an annular pattern against the backside of the substrate;

spinning the substrate to form a uniform coating of the material thereon, the fluid preventing the material from contacting the backside of the substrate;

forming an array of apertures in the masking material;

etching through the apertures in the masking material to form corresponding apertures in the oxide layer on the face of the substrate and to remove the oxide layer on the backside of the substrate; and diffusing a doping impurity through the apertures in the oxide layer to form regions of a second conductivity in the vicinity of said apertures in the oxide layer to form a uniform diode array.

10. A method of making a target for a television camera tube from a silicon substrate of n-type conductivity having a silicon dioxide layer on its face and on its backside opposite its face, wherein a uniform array of diodes is formed in the substrate, comprising:

positioning the backside of the substrate on a flat, free end of a tube so that the substrate is perpendicular to the axis of the tube;

producing a vacuum at the opposite end of the tube to hold the substrate on the free end thereof;

forcing air under pressure in an annular pattern against the backside of the substrate and radially outward from such backside;

flooding the face of the substrate with a photoresist masking material;

distributing the material on the face of the substrate and forming a meniscus of the material thereon;

rotating the tube to spin the substrate to further distribute the material on the face thereof and to produce a layer of the material of a predetermined thickness, the air under pressure preventing the material from contacting the backside of the substrate and aiding the vacuum in holding the substrate on the free end of the tube;

forming by photolithography an array of apertures in the material;

etching through the apertures in the material to form corresponding apertures in the silicon dioxide layer on the face of the substrate and to remove the silicon dioxide layer on the backside of the slice; and diffusing boron through the apertures to form regions of p-type conductivity in the vicinity of said apertures to form a uniform diode array in the face of the substrate.

11. An improved method of making a target for a television camera tube from a silicon substrate of n-type conductivity having a silicon dioxide layer on its face and on its backside opposite its face, wherein a masking material is applied to the face of the substrate, wherein an array of apertures is formed in the masking material, wherein another array of apertures is formed in the silicon dioxide layer on the face of the substrate by etching through the array of apertures in the masking material, wherein a doping impurity is diffused through the apertures in the silicon dioxide layer to form regions of p-type conductivity in the vicinity of said apertures in the face of the substrate, wherein the improvement comprises:

forcing a fluid under pressure from a source adjacent to and spaced from the substrate in an annular pattern against a selected portion of the backside of the substrate prior to the application of the masking material to the face of the substrate;

spinning the substrate to form a uniform coating of the material thereon, the fluid preventing the material from contacting the area within the seleced portion of the backside of the substrate; and etching the backside of the substrate to remove the silicon dioxide layer therefrom at the same time that the array of apertures is formed in the silicon dioxide layer by etching, whereby a uniform diode array is formed in the substrate after the doping impurity is diffused through the apertures in the silicon dioxide layer.

12. A method of selectively coating a portion of an article with a material, which comprises:

mounting the article adjacent to and spaced from an annular, fluid projecting nozzle;

projecting a fluid from the nozzle in an annular pattern against a selected portion of the article which is to be kept free of the material, and then radially outward from the selected portion of the article;

generating a partial vacuum with respect to the space surrounding the article within the volume formed by the nozzle, the projected fluid and the selected portion of the article; and conveying the material uniformly over the surface of the article toward the selected portion and into intersecting relation with the projected fluid, whereupon the fluid stops further conveyance of the material toward the partial vacuum associated with the selected portion of the article.

References Cited

UNITED STATES PATENTS

| | | | |
|---|---|---|---|
| 2,946,697 | 7/1960 | Petro | 117—38 |
| 3,494,326 | 2/1970 | Upton. | |
| 3,296,999 | 1/1967 | Gamble. | |
| 2,953,483 | 9/1960 | Torok | 117—212 |
| 3,526,204 | 9/1970 | Schnedler et al. | 118—8 |
| 3,426,727 | 2/1969 | Balain et al. | 118—52 |

ALFRED L. LEAVITT, Primary Examiner
K. P. GLYNN, Assistant Examiner

U.S. Cl. X.R.

117—8.5, 38, 101, 201; 118—52